(12) United States Patent
Ehrlichman et al.

(10) Patent No.: US 11,294,123 B2
(45) Date of Patent: *Apr. 5, 2022

(54) MODULATOR USING A MICRO-RING RESONATOR

(71) Applicant: Ramot at Tel-Aviv University Ltd., Tel-Aviv (IL)

(72) Inventors: Yossef Ehrlichman, Tel Aviv (IL); Ofer Amrani, Tel Aviv (IL); Shlomo Ruschin, Tel Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/841,887

(22) Filed: Apr. 7, 2020

(65) Prior Publication Data
US 2020/0233151 A1 Jul. 23, 2020

Related U.S. Application Data

(63) Continuation of application No. 16/076,373, filed as application No. PCT/IL2017/050142 on Feb. 6, 2017, now Pat. No. 10,620,375.

(Continued)

(51) Int. Cl.
  *G02B 6/293* (2006.01)
  *G02B 6/12* (2006.01)
  (Continued)

(52) U.S. Cl.
  CPC ..... *G02B 6/29338* (2013.01); *G02B 6/12004* (2013.01); *G02B 6/29343* (2013.01);
  (Continued)

(58) Field of Classification Search
  None
  See application file for complete search history.

(56) References Cited

U.S. PATENT DOCUMENTS 3,985,423 A  10/1976 Tseng
4,288,785 A   9/1981 Papuchon et al.
(Continued)

FOREIGN PATENT DOCUMENTS

| CN | 104133336 A | * 11/2014 |
|----|-------------|-----------|
| WO | WO 2017/137977 | 8/2017 |
| WO | WO 2018/000194 | 1/2018 |

OTHER PUBLICATIONS

International Search Report and the Written Opinion dated May 18, 2017 From the International Searching Authority Re. Application No. PCT/IL2017/050142. (10 Pages).
(Continued)

*Primary Examiner* — Michael Stahl (57) ABSTRACT

A modulator comprises one or more resonators. Each resonator has a light confining closed loop structure, such as a ring structure, and two, three or more electrodes associated with the light-confining structure, and may be a microresonator. An optical signal is modulated by a digital signal using the resonator. The procedure comprises obtaining the digital signal, mapping the signal using a mapping function to produce a transformed digital signal, the transformed digital signal being selected to produce, say linear, output from the resonator, inputting the transformed digital signal via electrodes onto the resonator; and modulating the optical signal via coupling from the resonator. Suitable mapping produces 16 QAM and other modulation schemes.

26 Claims, 10 Drawing Sheets

Related U.S. Application Data (60) Provisional application No. 62/292,896, filed on Feb. 9, 2016.

(51) Int. Cl.

| | | |
|---|---|---|
| *H04B 10/516* | (2013.01) | |
| *G02F 1/225* | (2006.01) | |
| *H03M 1/66* | (2006.01) | |
| *H04B 10/54* | (2013.01) | |
| *H04B 10/556* | (2013.01) | |
| *B82Y 20/00* | (2011.01) | |

(52) U.S. Cl.
CPC .............. *G02F 1/225* (2013.01); *H03M 1/66* (2013.01); *H04B 10/516* (2013.01); *H04B 10/541* (2013.01); *H04B 10/5561* (2013.01); *B82Y 20/00* (2013.01); *G02B 2006/12109* (2013.01); *G02F 2203/15* (2013.01)

(56) References Cited

U.S. PATENT DOCUMENTS

| | | | |
|---|---|---|---|
| 5,237,629 | A | 8/1993 | Hietala et al. |
| 6,760,111 | B1 | 7/2004 | Mark et al. |
| 8,044,835 | B2 | 10/2011 | Ehrlichman et al. |
| 8,588,556 | B1 | 11/2013 | Dong |
| 8,625,999 | B2 | 1/2014 | Robinson et al. |
| 10,620,375 | B2 * | 4/2020 | Ehrlichman ....... G02B 6/29338 |
| 2007/0212076 | A1 | 9/2007 | Roberts et al. |
| 2010/0104277 | A1 | 4/2010 | Robinson et al. |
| 2010/0156679 | A1 | 6/2010 | Ehrlichman et al. |
| 2010/0266233 | A1 | 10/2010 | Morris et al. |
| 2011/0044573 | A1 | 2/2011 | Webster et al. |
| 2014/0003761 | A1 | 1/2014 | Dong |
| 2014/0169724 | A1 | 6/2014 | Ingels |
| 2015/0016767 | A1 | 1/2015 | Akiyama |
| 2015/0063822 | A1 | 3/2015 | Noguchi |
| 2015/0261061 | A1 | 9/2015 | Akiyama |
| 2015/0316794 | A1 | 11/2015 | Hayakawa |
| 2016/0103382 | A1 | 4/2016 | Liboiron-Ladouceur et al. |
| 2017/0176779 | A1 | 6/2017 | Hauenschild et al. |
| 2019/0041720 | A1 | 2/2019 | Ehrlichman et al. |

OTHER PUBLICATIONS

Official Action dated Aug. 21, 2019 From the US Patent and Trademark Office Re. U.S. Appl. No. 16/076,373. (9 pages).

Official Action dated Jan. 22, 2019 From the US Patent and Trademark Office Re. U.S. Appl. No. 16/076,373. (8 pages).

Supplementary European Search Report and the European Search Opinion dated Sep. 10, 2019 From the European Patent Office Re. Application No. 17749969.6. (7 Pages).

Ehrlichman et al. "Generating Arbitrary Optical Signal Constellations Using Microring Resonators", Optics Express, 21(3): 3793-3799, Feb. 7, 2013.

* cited by examiner

MODULATOR USING A MICRO-RING RESONATOR

RELATED APPLICATIONS

This application is a continuation of U.S. patent application Ser. No. 16/076,373 filed on Aug. 8, 2018, which is a National Phase of PCT Patent Application No. PCT/IL2017/050142 having International Filing Date of Feb. 6, 2017, which claims the benefit of priority under 35 USC § 119(e) of U.S. Provisional Patent Application No. 62/292,896 filed on Feb. 9, 2016. The contents of the above applications are all incorporated by reference as if fully set forth herein in their entirety.

FIELD AND BACKGROUND OF THE INVENTION

The present invention, in some embodiments thereof, relates to a modulator constructed from optical closed-loop resonators, such as ring, disk, and elongated ring, or racetrack, resonators and, more particularly, but not exclusively, to a modulator constructed from a micro-ring resonator having multiple electrodes.

Attempts to apply photonic technologies to data processing have been tried for several decades. Yet, their implementation in practical systems remains limited and fails to penetrate practical processors. Many demonstrated optical devices remain oversized, are based on exotic materials and need complicated interfacing with other electronic components. Recent developments in micro-photonics and novel interfacing schemes may realize photonic components for fast communication and signal processing that overcome the above-mentioned shortcomings but only if basic physical and mathematical challenges can be solved.

A modulator based on an optical ring resonator is a set of waveguides in which at least one is a closed loop resonator coupled to some sort of light input and output. (These can be, but are not limited to being, waveguides.) When light of the resonant wavelength is passed through the loop from the input waveguide, it builds up in intensity over multiple round-trips due to constructive interference and is output to the output bus waveguide. The light may couple to the loop at the input and output. The output bus is the same as the input bus: input port, through/output port and in add-drop configuration, and there is an additional output port which is the drop port. Because discrete wavelengths are at resonance within the loop, the optical ring resonator functions as a filter.

To date the micro-ring resonator is a resonant light-confining structure with enhanced sensitivity to small changes in refractive index of the silicon.

SUMMARY OF THE INVENTION

A novel scheme for a miniature photonic modulator based on resonators, in particular closed loop resonators, which may be micro-resonators, for example micro-ring resonators, is presented, and references herein to micro-resonators are to be construed to refer to closed loop resonators in general.

The micro resonator has a segmented set of electrodes, where each of the electrodes is driven by a binary (two-level) signal. Combined with a digital memory lookup table, employed as a mapping function, a digital-input optical modulator may be formed. Based on the binary input vector, and the mapping function, the modulator can produce arbitrary, two-dimensional constellations of points.

As an example, the modulator may be used as a digital-to-analog converter, with a specific data content in the lookup table such that a digital linearization is performed. More generally, a digital to analog converter is a special case of a modulator, with operations that are equivalent. Thus a Pulse Amplitude Modulator that produces M distinct levels (M-PAM) at its output is the same as an M-level digital-analog-converter (DAC).

There may be provided phase, amplitude, or a combination of phase and amplitude modulation of an input (unmodulated) optical signal.

Additionally or alternately there may be a phase, amplitude, or a combination of phase and amplitude modulation of an input (already modulated) optical signal.

A digital linearization may be performed with a digital memory lookup table. It is shown, by means of simulation, that a 4-bit DAC can achieve ENOB of 3.74bits.

A modulator may consist of one or more micro-resonators, each having electrodes. A given input vector-length may be met by a corresponding number of electrodes, and depending on the vector-length the number of electrodes may be provided on a single micro-resonator or spread over several such resonators.

According to an aspect of some embodiments of the present invention there is provided a modulator or DAC comprising one or more resonators having light confining closed-loop or ring structures, including ring, elongated ring or racetrack, and disk structures, and at least two electrodes associated with the light-confining closed loop structures. The resonator may be actually coupled or ready to be coupled to an optical waveguide carrying an optical signal that is to be modulated by bits of an incoming digital signal, which bits are applied to the electrodes.

The resonator may comprise at least three or at least five electrodes, or any other number as appropriate.

In an embodiment, each electrode is controllable by a binary signal being one bit of the incoming digital signal, which may be of any vector-length, such as a nibble, a byte, a word, a double word, a quad word or larger. As an alternative, the electrodes may receive analog symbols.

In an embodiment, a number of electrodes is at least one greater than a number of input bits of an incoming vector.

An embodiment may comprise a map unit that maps input electrical signals onto selected electrodes in a way that is convenient to form points in a predetermined output or modulation format.

In an embodiment, the mapping unit produces a larger number of points than that used in the modulation format. From the larger number of output points, a smaller number is selected to form a group whose members are more readily distinguishable, or whose members are selected to form a linear output from the ring. The selected output points may form a modulation which may be any M-ary signal constellation, such as QAM, 16-QAM, 64-QAM, PAM, M-PAM, or may be PSK, M-PSK, M-ary pre-distorted constellation or a linear output.

In an embodiment, the map unit comprises a lookup table.

In an embodiment, the ring structure is elongated into a racetrack configuration having short sections and long sections and the electrodes are mounted on one, or more sections. Mounting of electrodes on long sections makes them easier to manufacture.

In an embodiment, the electrodes are of different lengths respectively. For example one electrode may be double the size of a preceding electrode in order on the ring. In another embodiment, different electrodes can be of the same length.

An embodiment may comprise first and second mutually decoupled closed loop resonators, for example, ring resonators, which are themselves separately coupled to a single waveguide.

An embodiment may provide an output or modulation format having intensity and phase components, wherein the first at least one resonator provides an output including both the phase and intensity components, while the second at least one resonator provides an output only including a phase component. In the case of a silicon implementation the second at least one resonator may mainly include the phase component.

As mentioned, the number of electrodes may be the same as or more than the incoming vector-length in bits. The electrodes may be on a single resonator or may be on several such resonators.

In an embodiment, the number of electrodes may be predetermined according to a vector length of the signal, and split between multiple resonator s, each resonator having a predetermined number of electrodes, and the plurality as a whole provides the desired vector-length in bits.

According to a second aspect of the present invention there is provided a method of modulating an optical signal using a digital input signal the modulating carried out using one or more closed loop resonators, the method comprising:

providing an optical signal;

obtaining a digital signal of a given vector-length;

mapping the digital signal using a mapping function to produce a transformed digital signal, the transformed digital signal being selected to produce a modulation output from the resonator or resonators that forms more easily distinguishable points;

inputting the transformed digital signal via the electrodes into the resonator or resonators; and modulating the optical signal via coupling from the resonator or resonator s.

The method may comprise mapping the signal via a mapping function to produce the transformed digital signal according to a predetermined modulation format.

The modulation may comprise points having both phase and intensity components.

One particular embodiment of a resonator may include a first set and a second set of mutually decoupled resonators of which the first set of resonators provide both phase and intensity output components and the second set of resonators provide only phase components. In a silicon implementation of the two-resonators the second ring may comprise mainly phase components.

According to a third aspect of the present embodiments there is provided an optical modulator or digital-analog converter (DAC) comprising at least one resonator, the resonator having a light confining closed-loop structure and at least two electrodes associated with the light-confining structure and connected to receive analog input signals. The resonator modulates an optical signal of an optical waveguide coupled thereto in response to the analog signals appearing on the electrodes.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to a micro resonator and its modification for use of one or more such resonators in a modulator, or Digital to Analog Converter (DAC), and, more particularly, but not exclusively, to use of a micro resonator that has multiple electrodes.

Herein, reference to a modulator also refers to a digital to analog converter (DAC) and vice versa, and reference to a micro-ring resonator includes resonators in general, including micro-resonators, and closed-loop resonators, which may be ring, racetrack or disk resonators, unless the context clearly shows otherwise.

A micro-resonator is typically of the size of tens of microns, where a lower bound may depend on the microfabrication technology. An upper bound for a micro-resonator would be about 10 mm, although resonators which are not micro-resonators are also included in the present embodiments.

If the modulator is made of micro-resonators then it may constitute a micro-modulator.

A modulator, micro modulator, or DAC, may comprise one or more resonators, for example micro resonators, having a light confining closed loop structure such as a ring or racetrack or disk or any other looped structure, and at least two electrodes mounted on the light-confining structure. The modulator is used to modulate an optical signal by a digital signal using one or more of the micro resonators. The procedure comprises obtaining the digital signal, which may be of any suitable length, including nibbles, bytes, words, double words, quod words or any other desired signal vector-length in bits, and mapping the signal using a mapping function to produce a transformed digital signal. The mapping is selected so that the transformed digital signal produces a desirable modulation output from the micro resonator. For example the mapping may be arranged to produce a linear output. The transformed signal is applied to the electrodes; and the optical signal is modulated via coupling from the micro resonator or resonators. Suitable mapping produces M-ary constellation of points, including M-ary QAM, 16-QAM, 64-QAM, PAM, PSK, M-PSK, M-ary pre-distorted constellation, a linear output, and other arbitrary, two-dimensional modulation schemes.

In an embodiment, the mapping is made onto a group of points which is larger than the constellation being used, and then some of the points are selected so as to produce a more easily distinguishable constellation.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present embodiments may provide a miniature photonic modulator based on micro resonators. The micro resonator is a resonant light-confining structure with enhanced sensitivity to small changes in refractive index of the silicon.

Multi-Electrode Micro-Ring Resonator as Optical Modulator and DAC

Figure 1:
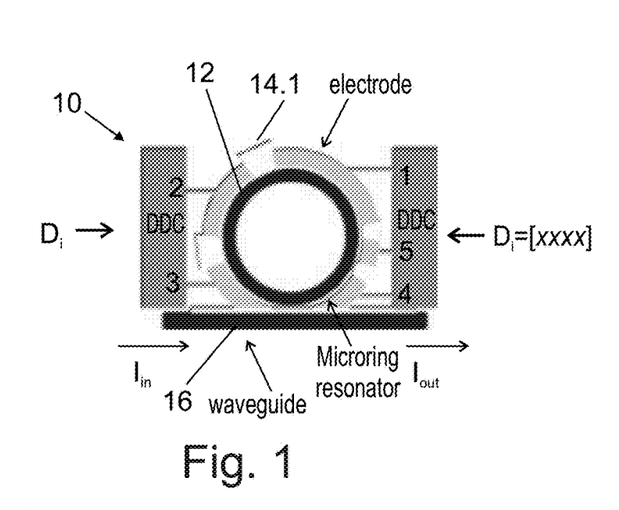
FIG. 1 is a simplified schematic diagram showing a micro-resonator according to a first embodiment of the present invention.

Reference is now made to FIG. 1 which is a simplified schematic illustration of a 4-bit modulator or DAC according to the present embodiments. A micro-ring modulator 10 comprises a micro-ring resonator 12 having a light confining closed loop structure, for example a ring, racetrack or disk structure, of which the ring structure is shown in FIG. 1. The resonator may include two or more electrodes that are associated with the closed loop structure. In the example, five electrodes are shown, numbered from 1 to 5. The micro-ring resonator may be coupled to an optical waveguide 16 carrying an optical signal to be modulated.

Figure 5:
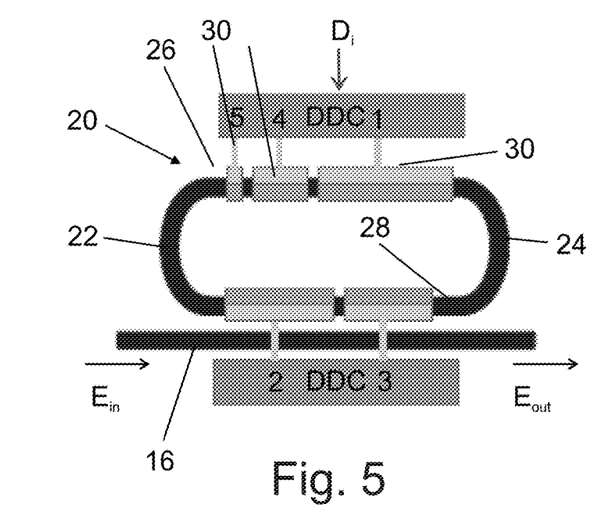
FIG. 5 is a simplified embodiment showing a micro-resonator elongated into a racetrack configuration with electrodes mounted on the straight part of the elongated track, according to an embodiment of the present invention, the micro-resonator being useful inter alia for QAM generation.
Figure 6:
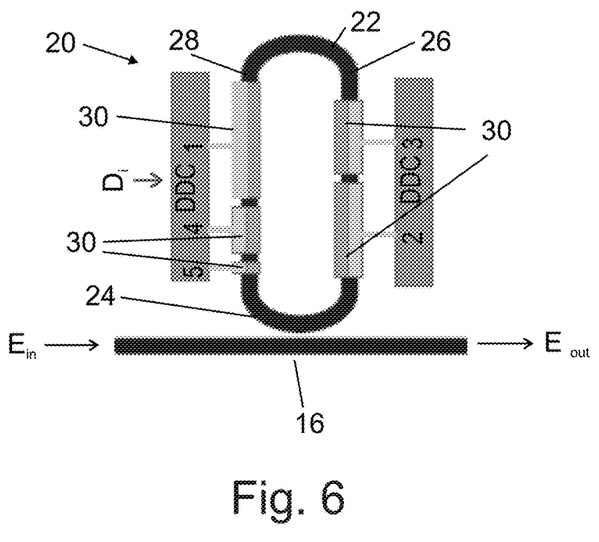
FIG. 6 is an alternative embodiment of an elongated multi-electrode micro-resonator according to an embodiment of the present invention, the modulator being useful inter alia for QAM generation.

A map unit or Digital to Digital convertor (DDC) maps input digital electrical signals to form a linear output from the micro-ring resonator. The map unit typically uses a lookup table. As shown in FIGS. 5 and 6 discussed below, the ring structure 13 is elongated into a racetrack configuration 20 having short sections 22 and 24 and long sections 26 and 28, and electrodes 30 are mounted on the long sections 26 and 28. Long section 28 runs alongside the optical waveguide 16, and the electrodes on section 28 are connected across the waveguide 16.

FIG. 6 is the same as FIG. 5, except that the racetrack is located with a short section opposite the optical waveguide 16. In the case of FIG. 6 no electrodes are connected across the waveguide. Note that in FIGS. 5 and 6, electrodes are located on both of the long sections, 26 and 28.

Figure 7:
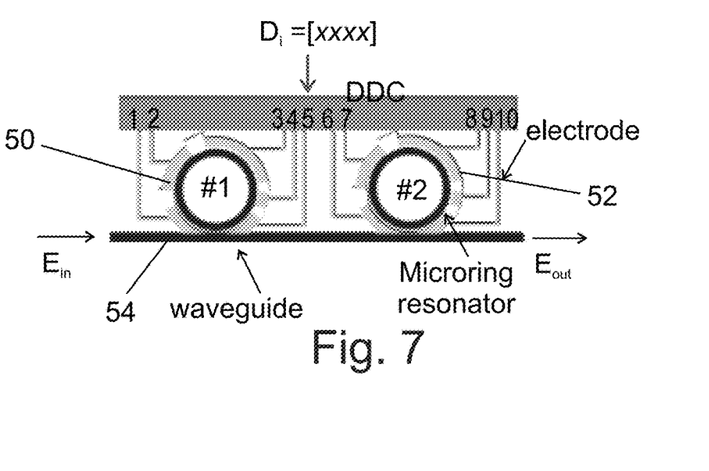
FIG. 7 is a simplified diagram showing a mutually decoupled resonator pair for QAM generation according to an embodiment of the present invention.

Reference is now made to FIG. 7, which is a simplified diagram showing a modulator made up of two decoupled rings 50 and 52. Each ring has five electrodes as in the previous examples which may combine. The two decoupled rings may be used together to output a modulation based on an M-ary constellation, for example 16 QAM.

The two mutually decoupled micro-ring resonators may be separately coupled to a single waveguide 54.

Figure 8:
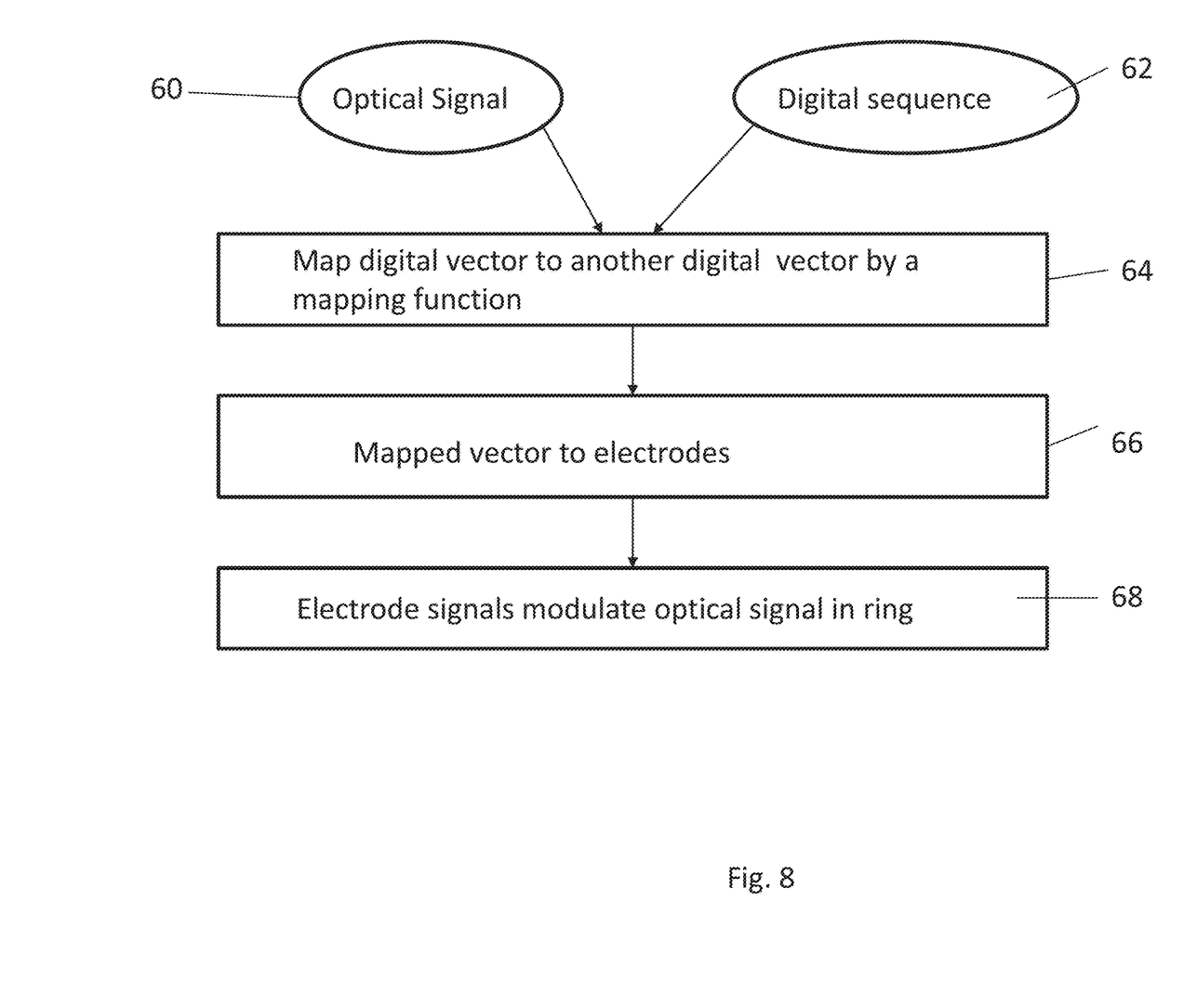
FIG. 8 is a simplified flow diagram showing the use of the modulator of the present embodiments to modulate an optical signal based on a digital sequence.

Reference is now made to FIG. 8, which is a simplified flow chart showing a method of digitally modulating an optical signal using the micro-ring resonator as described above.

In 60, an unmodulated, or an already modulated, optical signal is provided.

In 62, a digital sequence vector, such as a byte or a word, is obtained.

In box 64, the sequence is mapped by a mapping function to produce a transformed digital vector. The mapping function and the resulting transformed digital vector are selected to produce linear or other desired outputs from the micro resonator.

The transformed digital vector is then input via electrodes into the micro resonator in box 66. Then, in box 68, the signals from the electrodes modulate the optical signal within the micro resonator.

The modulation process may be implemented with coupling or may be for example plasma dispersion, or phase shifting.

The modulator may in one example be a pulse amplitude modulator (PAM), or digital-to-analog converter (DAC). The basic device layout is similar to previously published modulators based on micro-ring resonators, however it is distinguished in that it has separate electrodes. As illustrated in FIG. 1 there are five such electrodes numbered 1 to 5.

A CW light of wavelength $\lambda$ and intensity $I_{in}$ is coupled from the waveguide to the micro resonator. The coupling coefficient between the waveguide and the micro-resonator is t and the loss per round inside the micro-resonator is $\alpha$.

The light inside the micro-resonator is modulated by several, in this case M=5, independent phase shifter segments. The phase shifter can be implemented as a reversed-bias pn-diode or as a zig-zag pn diode, etc. Hereinafter, each phase shifter will be referred to as an electrode.

As an input, the DAC accepts a N=4-bits digital (electrical) vector, denoted Di, where i=1, . . . .N. The input vector is mapped onto each of the 5 electrodes via the digital-to-digital converter (DDC). The DDC outputs 5-bits that control the electrodes. Each electrode is driven by one of two voltage levels, 0 and V1, representing binary 0 and 1. The DDC can be viewed as a (high speed) digital memory or lookup-table (LUT).

An optical modulator is characterized by the product $V_\pi \cdot L$ where $V_\pi$ is the voltage that if applied on the electrode of length L, will induce a phase shift of $\pi$. We set $L=2\pi R_1$, i.e., as the circumference of the micro-ring.

Let index j denote the electrodes. In this example j=1 . . . 5. The length of each phase shifter or electrode is:

$$L_j = L \cdot 2^{-j}.$$

Note that $L \neq \Sigma L_j$.

If voltage $V_1$ is applied to electrode j then a phase shift $\phi_j$ will be induced:

$$\phi_j = k \frac{2\pi}{\lambda} \Delta n b_j L_j \quad (1)$$

where $\Delta n$ is the effective refractive index modulation due to the applied voltage $V_1$ on phase shifter j, k is an empirical constant that accounts for both the optical confinement and the coefficient of the charge density induced refractive index change. The parameter $b_j$ is a binary quantity which indicates whether voltage $V_1$ was applied on phase shifter j. The dependence between $\Delta n$ and the applied voltage $V_1$ is known to be nonlinear function, $f(V_1)$. The exact relation depends on the phase shifter design. The total intensity transmission of the micro-ring structure can be written as:

$$Iout = Iin \frac{a^2 - 2ta \cdot \cos\left(\sum_{j=1}^{M} b_{ij} L_j\right) + t_1^2}{1 - 2ta \cdot \cos\left(\sum_{j=1}^{M} b_{ij} L_j\right) + t^2 a^2} \quad (2)$$

where a binary matrix $B_i = \{b_{ij}\}$ of dimension M×N holds the mapping from input N=4-bit vector $D_i$ on the M=5 electrodes.

The Design Process

In order to maximize the output of the dynamic range, the micro-ring resonator may be designed to be in critical coupling, $\alpha=t$. This will set the lowest possible output intensity level to 0.

Figure 2:
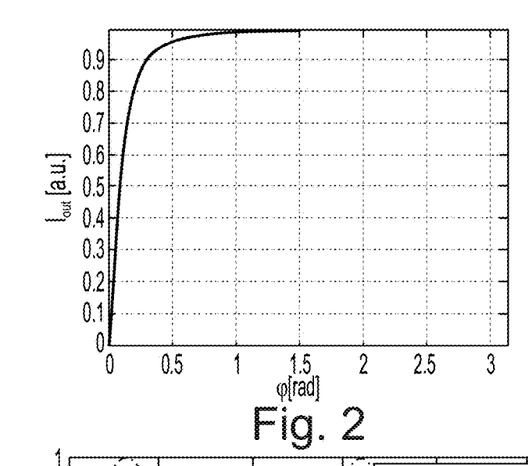
FIG. 2 is a graph showing normalized intensity against phase angle for a micro-resonator for phase shifts between 0 and $\pi$.

Reference is now made to FIG. 2, which shows the output intensity of a micro-ring resonator for phase shifts between 0 and $\pi$. Phase shifts higher than about 0.5[rad] contribute very little to the output dynamic range because of the high nonlinearity of the micro-ring modulator. Hence, the voltage $V_1$ may be set as the voltage that provides the intensity level $I\phi_1 = I_{in} - \Delta I$. In this example voltage $V_1$ was set to induce a phase shift that leads to an output dynamic range of about 93%. The quantity $\Delta I$ is chosen as a trade-off between best matching linearity and output dynamic range (DR). Lower values for $\Delta I$ increase the output dynamic range, but also will reduce the linearity of the device, unless additional electrodes are added. A dynamic range of about 90% of the total available DR may keep the electrode count low and close to the input bit length.

Figure 3:
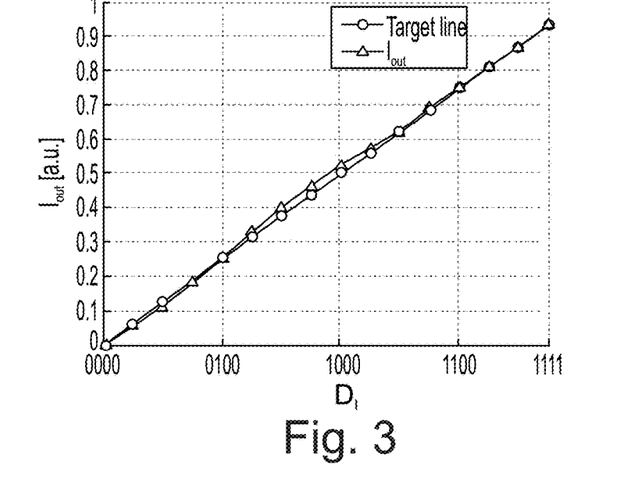
FIG. 3 is a simplified diagram showing output intensity of a 4-bit micro-modulator with five electrodes, wherein 16 points may serve as 16-PAM modulation, or a 16-level DAC.

Reference is now made to FIG. 3, which shows the output intensity of an ideal output 4-bit DAC (16 levels on a straight line), modulator with 5 electrodes. The graph shows output intensity of an ideal output of a 4-bit DAC (16 levels on a straight line) modulator with five electrodes. The example of 16 levels on a straight line may also serve as 16-PAM modulation.

Figure 4:
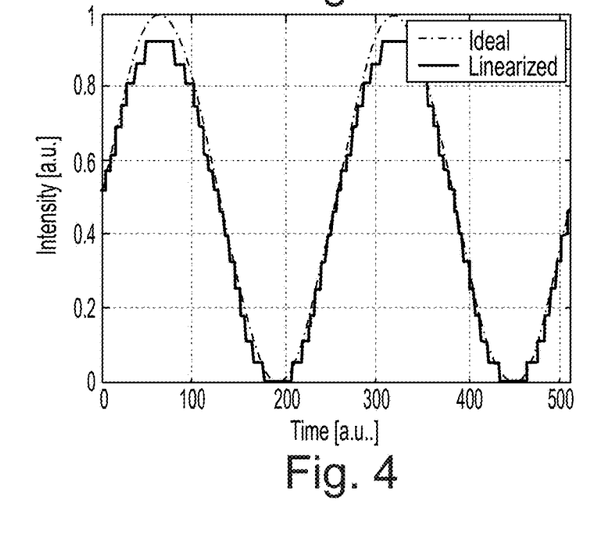
FIG. 4 is a simplified diagram showing a sinewave generated using a 4-bit micro-resonator device having five electrodes as shown in FIG. 3.

FIG. 4 shows a sinewave generated with the device. The linearity of the device when employed as a DAC can be quantified by a standard figure of merit. The Differential Non-Linearity (DNL) is 0.2 bits, the Integral Non-Linearity (INL) is 0.4 bits and the Effective Number of Bits (ENOB) is 3.74 bits.

Implementation with Racetrack

Returning now to FIG. 5, an embodiment is shown using a racetrack resonator. A high precision modulator may require a larger number of electrodes to be deposited on the micro-ring and from a manufacturing point of view, the task is simplified by using the long straight lengths 26 and 28 of the racetrack configuration 20. The optical working of the racetrack resonator is the same as the micro-ring resonator of FIG. 1. However, the racetrack provides a more practical platform to implement a large number of electrodes (phase shifters). FIG. 6 illustrates another implementation for a multi-electrode racetrack modulator, in which, as discussed, the long straight lengths are perpendicular to the waveguide.

FIG. 7 illustrates a mutually decoupled ring for QAM generation. QAM generation is discussed in greater detail hereinbelow. In the embodiment of FIG. 7, the two rings 50 and 52, although mutually decoupled, work together and are both coupled to the same optical fiber 54, thus providing ten rather than five electrodes in the example. As will be discussed in greater detail below, it is possible to map both phase and intensity to get a set of 4×4 points as required for a square 16 QAM constellation. The points are selected from a much larger cloud of possible points and thus it is relatively easy to exceed the 16 dB EVM often regarded as standard for effective communication.

An alternative may use four or five mutually decoupled rings, each with one or more electrodes.

One embodiment uses the cloud of available points for signals to the electrodes to compensate for predistortion. A different one of some 1000 available points are chosen for different input signals to make sure that the signal arriving is not distorted. Predistortion is dealt with more simply in the present embodiments as the system is in any event selecting from a larger set of points. The predistortion system may be dynamic. In an example of a dynamic system a training sequence is transmitted at regular intervals. The received version has an easily measurable distortion since the training sequence is known and thus the measured distortion can be used to update to the lookup table. An example of predistortion is discussed below in relation to FIGS. 14A and 14B.

Thus the present embodiments may provide a digital-to-analog modulator based on a single micro-ring resonator or a racetrack resonator. The multielectrode approach enables modulation of the micro-resonator directly with digital signals.

Advanced Modulation Formats

Modulation schemes such as binary phase-shift-keying (PSK) and quadrature-PSK (QPSK) are typically limited to transmitting a few tens of Giga-bits per second on a fiber-optic channel. Approaching the 100 Gbit/sec range with DQPSK modulation would require a high signaling rate of 50 Baud, or 25 Baud if polarization multiplexing is used. To alleviate this problem, multilevel modulation schemes, such as M-ary QAM (or multi-phase modulation such as M-PSK) can be used.

Quadrature amplitude modulation (QAM) is a modulation scheme that conveys data by means of modulating both the amplitude and the phase of a sinusoid carrier, thus providing spectral efficiencies in excess of 2 bit/symbol. The present embodiments may provide a method for generating arbitrary M-ary constellations by applying direct digital drive, which facilitates the use of only two voltage levels for controlling each of the electrodes. Furthermore, the modulator is composed of the two micro-ring resonators as shown in the configuration of FIG. 7.

In addition there are some basic definitions and then a mathematical description of the proposed modulator. The structure of the modulator is discussed in detail with respect to a 16 QAM constellation.

This is followed by a discussion of various aspects related to the design of the modulator such as the number of electrodes and the binary driving voltage levels.

The error-vector magnitude (EVM) is employed as a measure of accuracy of a generated set of points with respect to the ideal set.

Generation of M-Ary Constellations Using a Direct Digital Drive Micro-Ring Resonators—Modulator Construction The steady-state transfer function of a single-waveguide multi-electrode micro-ring resonator is as follows:

$$\frac{E_{out}}{E_{in}} = \exp[j(\pi + \phi)]\frac{\alpha - t\exp - j\phi}{1 - t\alpha\exp(j\phi)} \quad (3)$$

where t and α are the coupling factor and internal loss factor, respectively. The accumulated phase shift over one round-trip is $$\phi = \sum_{j=1}^{N} \phi_j(V_j) + K \quad (4)$$

where $\phi_j(V_j)$ is the phase accumulated for passing electrode length $L_j$ with voltage $V_j$ applied thereto. The application of the voltage changes the refractive index and the accumulated phase shift over the path $L_j$. The constant K is the residual phase shift that is accumulated over the section with no electrodes are laid upon. For voltages Vj=0, j=1 . . . N, the accumulated phase shift is $\phi=2\pi$.

The role of an M-Ary modulator is to generate a specified constellation of points which is composed of M distinct complex points (also referred to as signals); the constellation points can be generally formulated as follows:

$$S_i = T_i e^{j\theta_i}, T_i > 0, 0 \leq \theta_i \leq 2\pi, i=1, \ldots, M. \quad (5)$$

Figure 9A:
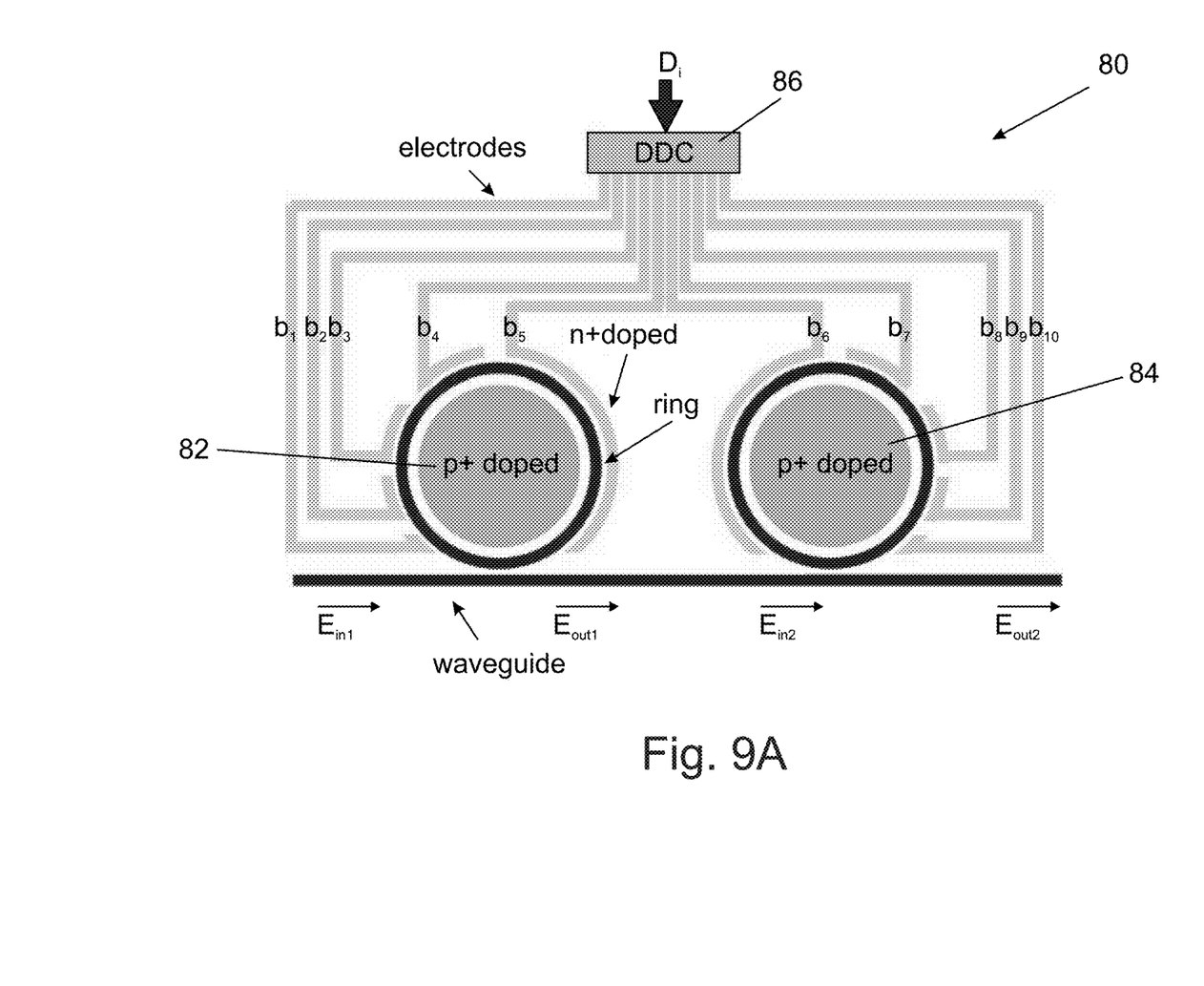
FIG. 9A is a simplified diagram showing a 16 QAM optical modulator based on two micro-ring resonators equipped with multiple electrodes according to an embodiment of the present invention.

The proposed modulator is described by means of an example:

Reference is now made to FIG. 9A, which depicts a 16 QAM optical modulator based on two micro-ring resonators 82 and 84, each equipped with multiple electrodes b1 . . . b10. The electrodes in this example are divided between the two micro-rings: 5 electrodes on one micro-ring, and 5 on the other micro-ring. As an input, the QAM modulator accepts a 4-bit digital input vector denoted $D_i$. The input vector is mapped by a digital-to-digital converter (DDC) 86 onto each of the 10 (electrode) segments, whose lengths (per micro-ring) follow a divide-by-two sequence. That is to say the input vector is mapped onto each of the 10 electrodes via the digital-to-digital converter (DDC) 86. The DDC 86 outputs bits that control the electrodes on both rings 82 and 84. Thus, each electrode is driven by one of two voltage levels, 0 and v, representing binary 0 and 1, respectively.

The above description suggests that the DDC can be viewed as a (high speed) digital lookup table (LUT).

More generally, Let $L^{(1)}=(L_1^{(1)}, L_2^{(1)}, \ldots L_{N_1}^{(1)})$ and $$L^{(2)}=(L_1^{(2)}, L(hd 2^{(2)}, \ldots L_{N_2}^{(2)})$$

be two vectors of dimensions $N_1$ and $N_2$, whose elements correspond to the lengths of the electrodes of the top arm and the bottom arms respectively.

Let $B(^1)$ be a binary $M \times N_1$ matrix. Row i of $B^{(1)}$, $B_i^{(1)}$, holds the mapping from input $D_i$ onto the $N_i$ electrodes of the top arm.

Likewise, binary matrix $B(^2)$, of dimensions $M \times N_2$, holds the mappings from each of the input digital vectors to the bottom $N_2$ electrodes.

With this nomenclature, the output of the modulator can be formulated as a function of the digital input Di:

$$E_{out}(D_i) = E_{in}\exp[j(\pi + \phi_1)] \quad (6)$$

-continued $$\frac{\alpha_1 - t_1\exp - j\phi_1}{1 - t_1\alpha_1\exp(j\phi_1)} \cdot \cdot \exp[j(\pi + \phi_2)] \frac{\alpha_2 - t_2\exp - j\phi_2}{1 - t_2\alpha_2\exp(j\phi_2)}$$

and the phase shifts are $$\phi_1 = \pi \frac{v}{v_\pi} \sum_{j=1}^{N_1} B_{ij}^{(1)} L_j^{(1)} \qquad (7,8)$$

$$\phi_2 = \pi \frac{v}{v_\pi} \sum_{j=1}^{N_2} B_{ij}^{(2)} L_j^{(2)}$$

where $E_{in}$ denotes the amplitude of the optical field entering the modulator, and $v_{90}$ denotes the so-called half-wave voltage. This is the voltage required for inducing a phase change of $\pi$ in a modulator with a single electrode of normalized length L=1.

Since the application of the electrical signals is directly upon the electrodes, which avoids undesirable mediating circuitry, we refer to this approach as Direct Digital Driving.

Modulator Design

An amplitude modulator and a phase modulator are provided as disclosed in the paper "Generating arbitrary optical signal constellations using micro-ring resonators" that was published in Optics Express in 2013.

Defining the set of parameters t1, a1 to define Ring #1 and t2, a2 to define Ring #2, the design process involves setting the values of the transmission and loss factors t1 and a1 of Ring #1, in such a way the total transmission of the modulator is nearly linear with changes in the phase $\phi$1 (concurrent phase modulation is unavoidable). In the second ring $\phi$2 modulates mostly the phase, compensating for the phase variations induced by Ring #1, and determining the total desired output phase changes. Thus, Ring #1 is designed to work in critical coupling mode, t1=a1, which allows a large range of intensities from almost zero to the maximum. Ring #2 is in an over-coupled regime in which t2<a2.

The design of the modulator involves the setting of electrode lengths $L^{(1)}$, $L^{(1)}$, $L^{(2)}$ and DDC mappings $B^{(1)}$, $B^{(2)}$, for accurately generating the required set of signals given by Equation 5.

From Equation 6, it follows that the two multi-electrode micro-rings modulators $N_1$ electrodes on one, and $N_2$ on the other, are capable of generating at most $2^{(N_1+N_2)}$ distinct signals assuming (binary) direct digital drive is employed. The total number of electrodes $N_1+N_2$ required for generating M distinct points should satisfy $M \leq 2^{N_1+N_2}$.

Practically, equality rarely suffices. From this pool of $2^{(N_1+N_2)}$ points, M points are drawn such that they provide the closest set of points to the ideal M-QAM.

By increasing the number of electrodes, a larger set of candidate output points is obtained. We shall denote this set of points as the signal pool. Obviously, as the number of points in the pool is increased, the required constellation of points given by Equation 5 can be drawn from the pool with more accuracy.

Figure 9B:
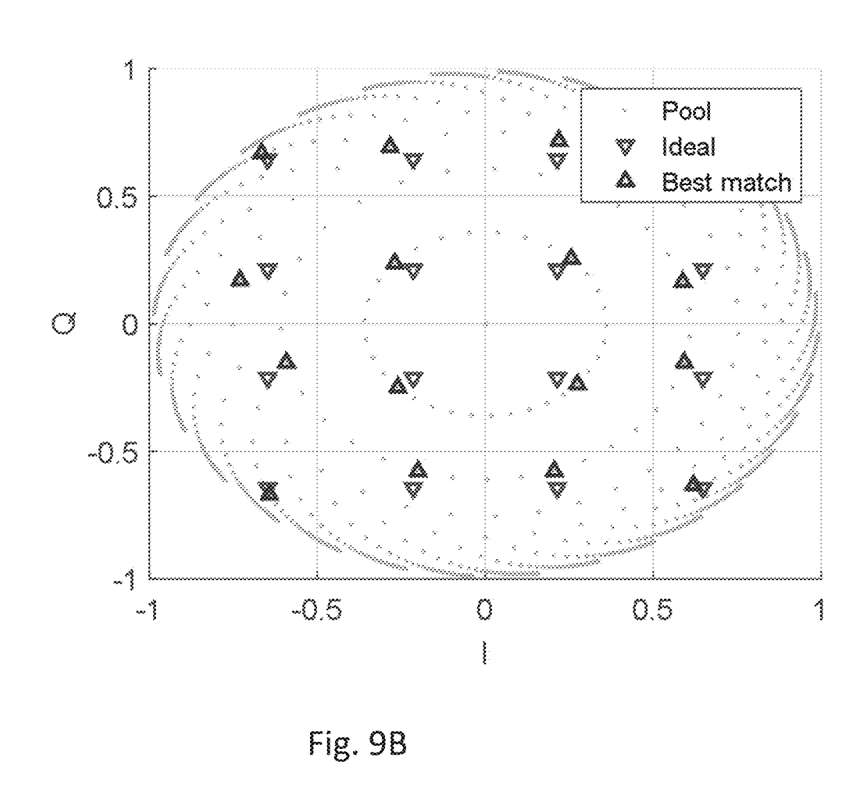
FIG. 9B is a simplified diagram showing a square-16 QAM signal constellation obtained from a signal pool generated using $N_1=6$, $N_2=6$ electrodes according to an embodiment of the present invention.

As an example, assume that a square-16 QAM is the required signal constellation. FIG. 9B depicts this constellation along with a signal pool generated using $N_1=6$, $N_2=6$ electrodes.

From this pool of $2^{12}$ points, 16 points are drawn (highlighted in the figure) such that they provide the closest set of points to the ideal 16 QAM.

Note that the drawn set, and the ideal set of points are in good agreement due to the large number of points in the pool.

The 6-tuple, and 6-tuple binary vectors associated with each of the drawn points may be stored in the lookup tables $B^{(1)}$, $B^{(2)}$, respectively. Hereinafter we shall assume that the normalized electrode lengths follow a divide-by-two pattern, that is $L_j=2^{-j}$.

FIGS. 9A-B illustrates illustrate an ideal 16 QAM set (▼) from an available signal pool. The 16 QAM is generated using two micro-ring modulators with 6 and 6 electrodes per ring; generated 16 QAM constellation (Δ) i.e. 16 points drawn from the pool.

For the following parameters: 6+6 electrodes, t1=a1=a2=0.99, t2=0.1, actuating voltages: 0.08*Vpi and 2*Vpi.

Direct Digital Drive with Uncoupled Micro-ring Modulators in Tandem

Figure 10:
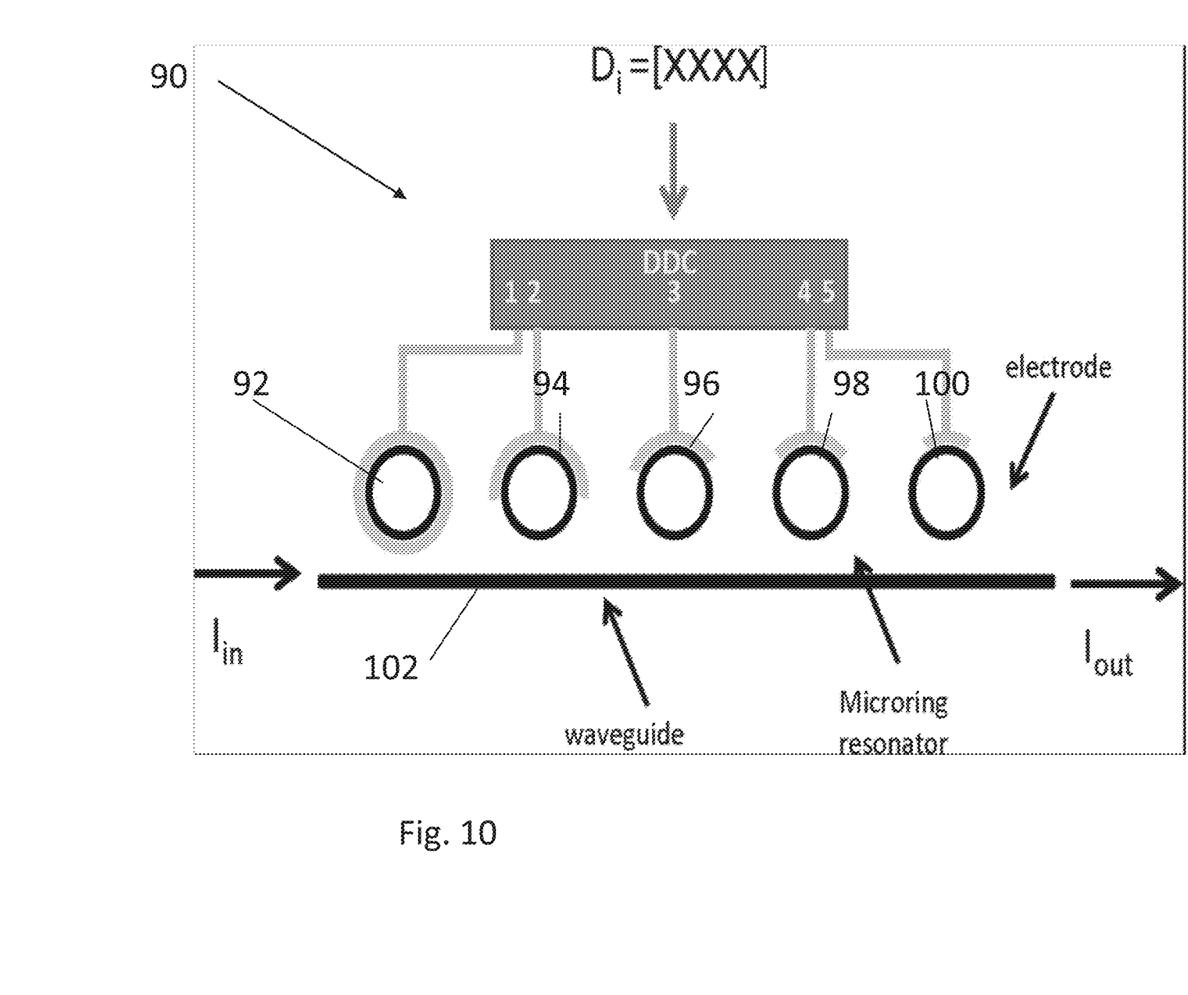
FIG. 10 is a simplified diagram showing a 4-bit digital-to-analog converter (DAC), 16-PAM modulator, based on 5 micro-ring resonators in series according to an embodiment of the present invention.

Reference is now made to FIG. 10, which is a schematic illustration of a 4-bit digital-to-analog converter (DAC), 16-PAM modulator 90, based on 5 micro-ring resonators 92, 94, 96, 98, 100 in series. The 4-bit digital-to-analog converter (DAC), based on 5 micro-ring resonators in series as presented in FIG. 10, uses a CW light signal of wavelength λ and intensity $I_{in}$ which is coupled from waveguide 102 to the micro-ring resonator.

The coupling coefficient between the waveguide and each micro-ring is t and the loss per round inside the micro-ring is α.

The light inside each micro-ring is modulated by a phase shifter. The phase shifter can be implemented as a reversed-bias pn-diode or as a zig-zag pn diode, etc. From now on each phase shifter will be referred to as an electrode.

As an input, the DAC accepts aN=4-bits digital (electrical) vector, denoted $D_i$. The input vector is mapped onto each of the M=5 electrodes via the digital-to-digital converter (DDC). The DDC outputs 5-bits that control the electrodes. Each electrode is driven by one of two voltage levels, 0 and $V_1$, representing binary 0 and 1. The DDC can be viewed as a (high speed) digital LUT.

Each optical modulator is characterized by the product $v_\pi L$ where $v_\pi$ is the voltage that if applied on the electrode of length L, will induce a phase shift of $\pi$.

We set $L=2\pi R_1$, i.e., as the circumference of the micro-ring.

Let index j denote the electrodes. In this example j=1, 2, . . . 5. The length of each phase shifter or electrode is: $l_j = 2^{-M \cdot 2^{-j}}$ For a modulator or DAC with N=4, and M=5, the electrode lengths are 1j={0 8, 0.42, 0.65, 0.81, 0.9}.

If voltage $V_1$ is applied on electrode j then a phase shift $\phi_j$ will be induced:

$$\phi_j = k\frac{2\pi}{\lambda}\Delta n b_j l_j \qquad (9)$$

where Δn is the effective refractive index modulation due to the applied voltage $V_1$ on phase shifter j, k, is an empirical constant that accounts for both the optical confinement and the coefficient of the charge density induced refractive index change. The parameter $b_j$ is a binary quantity which indicates whether voltage $V_1$ was applied on phase shifter j. The dependence between $\Delta n$ and the applied voltage $V_1$ is known to be a nonlinear function, $f(V_1)$. The exact relation depends on the phase shifter design. The total intensity transmission of the micro-ring structure can be written as:

$$I_{out} = I_{in} \Pi_{j=1}^{M} I_j^{b_{ij}} \tag{10}$$

where a binary matrix $B_i = \{b_{ij}\}$ of dimensions M×N holds the mapping from input N=4 bit vector $D_i$ on the M=5 electrodes.

Figure 11:
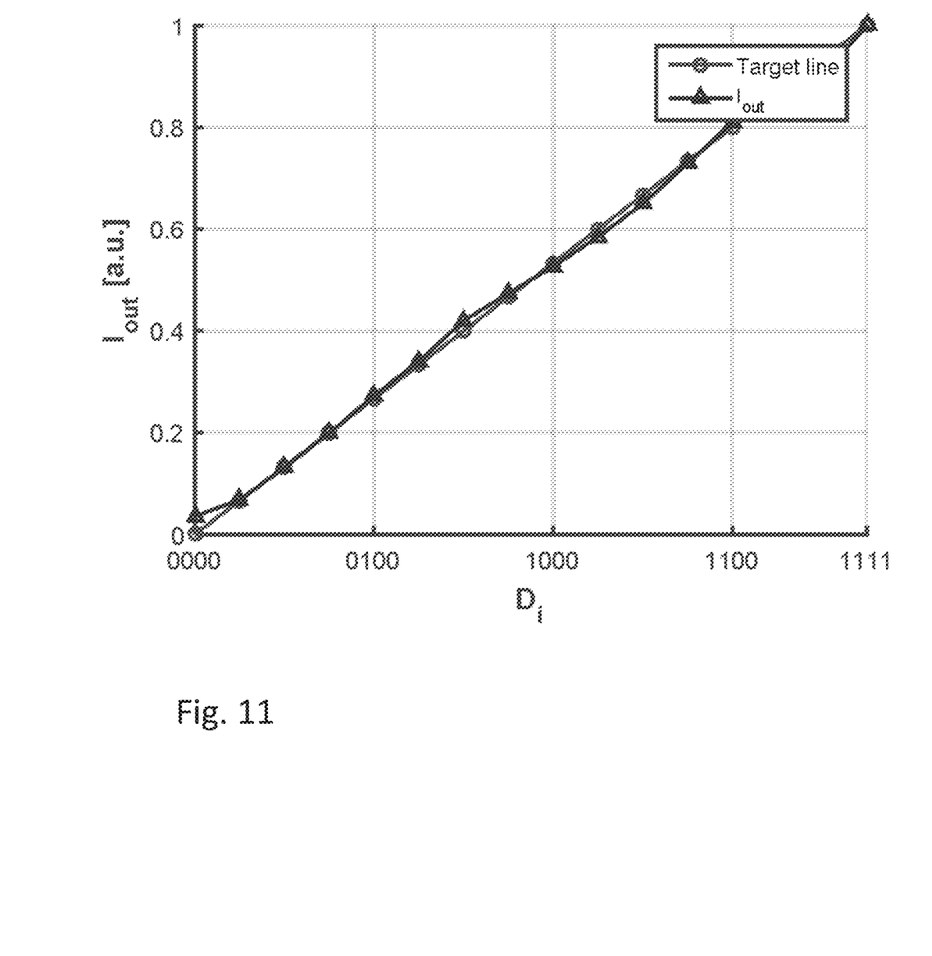
FIG. 11 is a simplified diagram showing the output intensity of an ideal output 4-bit DAC (16 levels on a straight line), with 5 micro-rings, according to an embodiment of the present invention.

FIG. 11 is a simplified graph which shows the output intensity of an ideal output 4-bit DAC (16 levels on a straight line), with 5 micro-rings.

Figure 12:
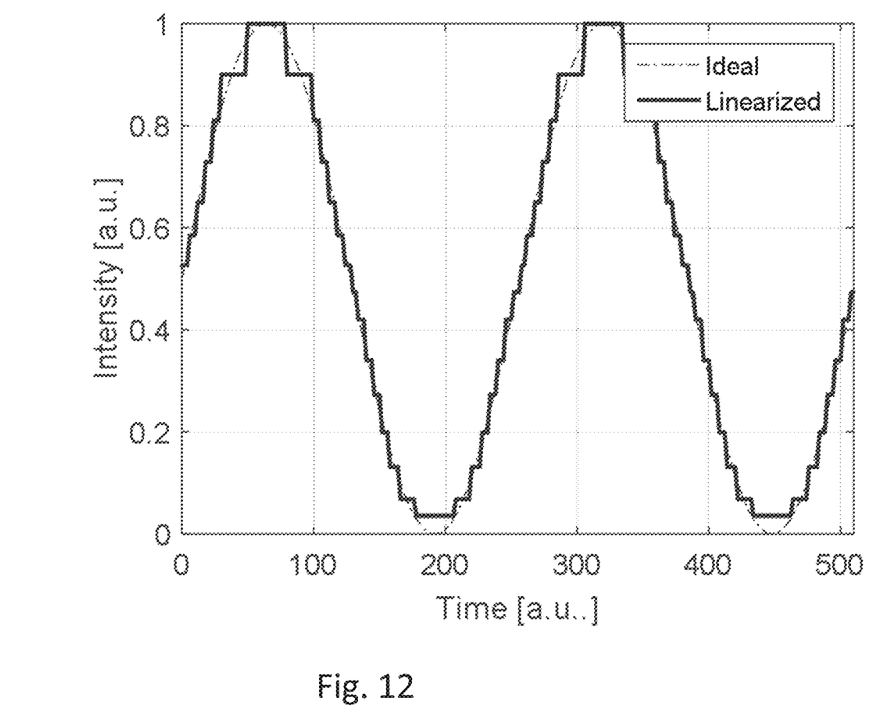
FIG. 12 is a simplified diagram showing a sinewave generated with the device of FIG. 10.

FIG. 12 is a simplified graph which shows a sinewave generated with the device. The linearity of the DAC can be quantified by standard figure of merits. The Differential Non-Linearity (DNL) is 0.6 bits, the Integral Non-Linearity (INL) is 0.57 bits and the Effective Number of Bits (ENOB) is 3.54 bits.

This latter section thus shows a digital-to-analog modulator based on multiple micro-ring resonators or racetrack resonators in tandem. The approach enables modulating of the micro-rings directly with digital signals.

The embodiments may be implemented using silicon.

A whispering gallery can be a possible implementation of the present embodiments, in place of a micro-ring resonator.

Figure 13A:
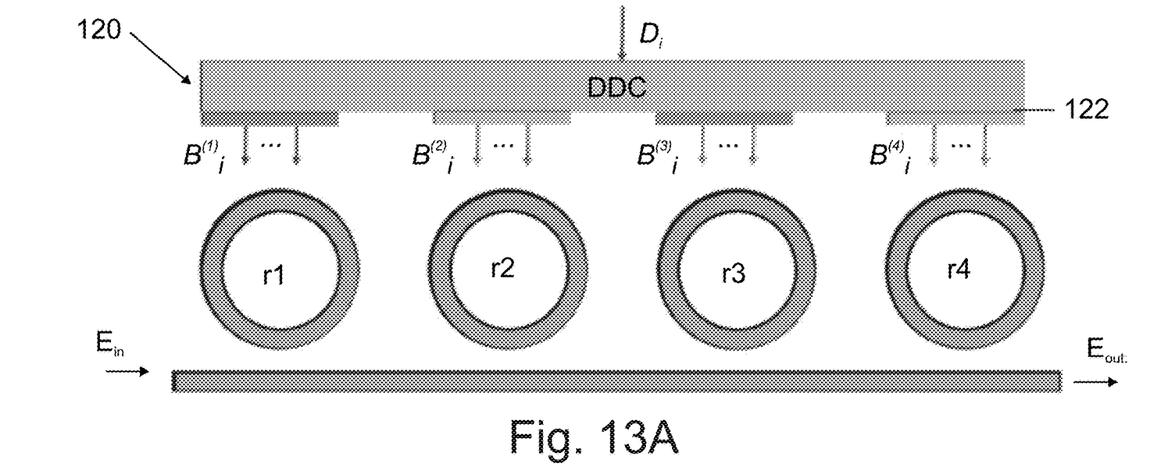
FIG. 13A is a simplified diagram showing a multi-ring modulator with a reduced number of electrodes per ring, according to an embodiment of the present invention.
Figure 13B:
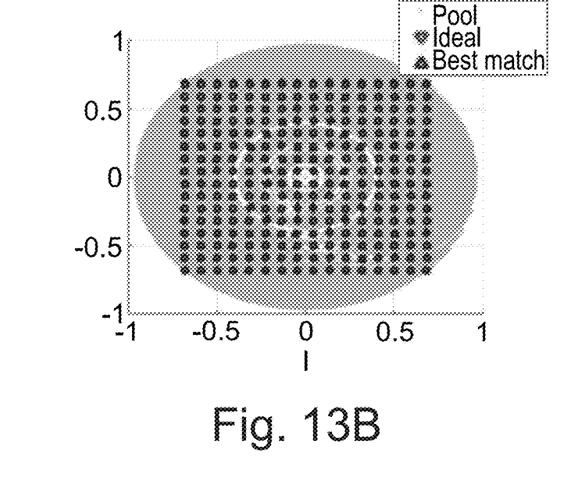
FIG. 13B is a simplified diagram showing a pool of signal points from which to find a best set for 256 QAM using the embodiment of FIG. 13(a)A.

Reference is now made to FIGS. 13A and 13B which illustrate a further embodiment of the present invention. In FIG. 13A a multi micro-ring modulator 120 has a configuration in which the number of micro-resonators r1 . . . r4 has been increased, but the number of electrodes per modulator has been reduced. The digital sequence D1 is input in the same way as above via DDC 122 and mapped to a function which is then output as before via the electrodes $B^{(1)}i$ . . . $B^{(4)}$ to modulate the optical signal in the micro-resonators.

The number of distinct electrode segments that can be effectively mounted on a single micro resonator is limited by manufacturing abilities and tolerances. Thus there is a limit to the number of electrodes and thus the order of the modulation set. The embodiment of FIG. 13A overcomes this limitation, as the original configuration can be augmented by additional rings with additional electrodes. Thus for example, rather than generating 256 -QAM with 7 and 8 electrodes on each ring, one can utilize 4 micro-resonators with 5 electrodes on each ring. In such a configuration, two of the rings may act as amplitude modulators while the other two may act as phase modulators.

FIG. 13B shows a dense pool from which a 256-QAM set can be obtained. For the same parameters as above, with the new configuration of 4 micro-resonators, an EVM of −32 dB is achieved. If the voltage level on resonator no. 3 is attenuated by half, an EVM of −41 dB can be achieved. The attenuation of the voltage enables resonator amplitude no. 3 to better cover the center levels of the signal constellation, as can be seen in FIG. 13B. The doubling of the phase shift modulators allows the burden of generating a $2\pi$ phase shift to be divided between two modulators. Now each modulator has to generate only up to a $\pi$ phase shift.

Thus using the multi-ring embodiment of FIG. 13A and the best matches from the pool of FIG. 13B, a 256-QAM using 4 resonators with 5 electrodes on each resonator may provide an EVM of −41 dB.

Figure 14A:
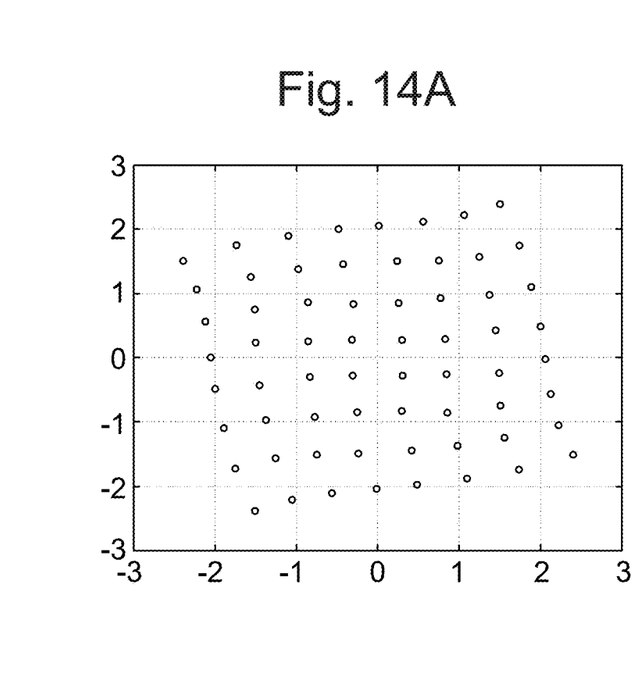
FIG. 14A is a simplified diagram showing a pre-distortion QAM signal where distortion is introduced by the optical fiber.
Figure 14B:
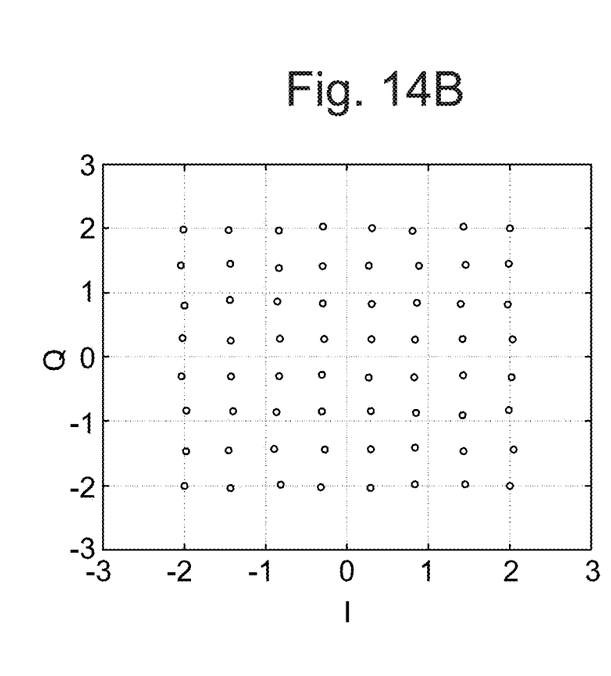
FIG. 14B is a simplified diagram showing the constellation as seen at a receiver after the pre-distorted signal has propagated through the receiver.

Reference is now made to FIGS. 14A and 14B which illustrates the use of predistortion on a QAM signal. In general signals passing through any kind of channel tend to be distorted, and one way of dealing with the distortion is to obtain knowledge of the characteristics of the distortion and then predistort the signals at the start to compensate so that the receiver obtains undistorted signals.

FIG. 14A illustrates an exemplary predistortion of a constellation that may be introduced at an optical fiber used in accordance with embodiments of the present invention. The distortion may be introduced using self-phase modulation. FIG. 14B shows the constellation at the receiver after the predistorted signal has propagated through the optical fiber.

It is expected that during the life of a patent maturing from this application many relevant silicon and ring structures will be developed and the scope of the corresponding terms are intended to include all such new technologies a priori.

The terms "comprises", "comprising", "includes", "including", "having" and their conjugates mean "including but not limited to".

The term "consisting of means" "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the above description is to be construed as if this combination were explicitly written. Conversely, various features of the invention, which are, for brevity, described in the context of a single embodiment, may also be provided separately or in any suitable sub-combination or as suitable in any other described embodiment of the invention, and the above description is to be construed as if these separate embodiments were explicitly written. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An optical modulator, comprising at least one resonator, the resonator having a light confining closed-loop structure and at least two electrodes associated with said light-confining structure and connected to receive input bits related to a digital electrical input signal, the resonator configured for modulating an optical signal of an optical waveguide coupled thereto, said modulating being in response to input bits appearing on said electrodes, the modulator further comprising a mapping unit, the mapping unit being a digital to digital converter, the mapping unit configured for mapping input electrical signals onto selected electrodes to generate output points of a predetermined output format.

2. The modulator of claim 1, wherein said at least one resonator comprises at least three or at least five electrodes.

3. The modulator of claim 1, configured such that each bit of said digital electrical signal controls at least one of said at least two electrodes.

4. The modulator of claim 1, configured to use a test signal to revise said mapping onto different ones of available output points of said predetermined output format to carry out predistortion.

5. The modulator of claim 4, wherein said mapping unit is a digital to digital convertor, and wherein the number of electrodes is at least one greater than a number of input bits.

6. The modulator of claim 5, wherein said mapping unit is further configured such that said output points form one member of the group of predetermined output formats comprising an M-ary signal constellation, M-ary QAM, 16-QAM, 64-QAM, PAM, M-PAM, PSK, M-PSK, M-ary pre-distorted constellation and a linear output.

7. The modulator of claim 4, wherein said mapping unit comprises a lookup table.

8. The modulator of claim 1, wherein said closed loop structure is one member of the group comprising a ring structure, an elongated ring structure and a disk.

9. The modulator of claim 8, wherein said closed loop structure is said elongated ring structure, and said elongated ring structure comprises long sections and short sections and wherein said electrodes are mounted on one or more of said long sections.

10. The modulator of claim 1, wherein said at least two electrodes are of different lengths respectively.

11. The modulator of claim 1, wherein electrodes on a given one of said at least one resonator are of different lengths in an order and one of said electrodes in said order is double the size of a preceding electrode in said order.

12. The modulator of claim 1, wherein said at least one resonator comprises a plurality of mutually decoupled resonators separately coupled to said waveguide.

13. The modulator of claim 1, configured to provide an output format having intensity and phase components, wherein a first of said at least one resonator provides an output including both said phase and intensity components, while a second of said at least one resonator provides an output mainly including said phase component.

14. The modulator of claim 1, comprising a plurality of said at least one resonator, each resonator having a predetermined number of electrodes, such that said plurality provides a predetermined vector-length in bits.

15. The modulator of claim 1, wherein the at least one resonator comprises silicon.

16. The modulator of claim 1, configured for use as a digital to analog converter.

17. A method of modulating an optical signal using a digital input vector, said modulating carried-out using one or more resonators, the method comprising:
providing an optical signal;
obtaining a digital input signal comprising a plurality of bits,
mapping said bits of said digital input signal using a mapping function to produce a transformed digital signal, the transformed digital signal being selected to apply distinct modulations to an optical signal in said resonator;
applying bits of said transformed digital signal to respective electrodes of said one or more resonators; and
modulating said optical signal by coupling said optical signal to said one or more resonators while applying said bits of said transformed digital signal.

18. The method of claim 17, further comprising mapping said digital input signal via a mapping function to produce said transformed digital signal as points of a predetermined output format.

19. The method of claim 18, wherein said points comprise both phase and intensity components.

20. The method of claim 17, wherein said resonator comprises first and second mutually decoupled resonators of which said first resonator provides both phase and intensity output components and said second resonator provides mainly phase components.

21. The method of claim 18, wherein said predetermined output format is one member of the group consisting of: an M-ary constellation, M-ary QAM, 16-QAM, 64-QAM, PAM, M-PAM, PSK, M-PSK, M-ary pre-distorted constellation and a linear output.

22. The method of claim 17, wherein said resonator is a disk.

23. The method of claim 17, wherein said digital input signal has a predetermined vector length in bits, the method comprising providing a number of electrodes spread over a plurality of resonators, said number of electrodes equaling or exceeding said predetermined vector-length.

24. The method of claim 17, comprising using said modulating to provide digital to analog conversion.

25. An optical modulator, comprising at least two resonators, the resonators respectively having a light confining closed-loop structure and at least two electrodes associated with said light-confining structure and connected to receive input bits related to a digital electrical input signal, the resonators configured for modulating an optical signal of an optical waveguide coupled thereto, said modulating being in response to input bits appearing on said electrodes, the modulator configured to provide an output format having intensity and phase components, wherein a first of said resonators provides an output including both said phase and intensity components, while a second of said resonators provides an output mainly including said phase component.

26. The modulator of claim 25, the modulator further comprising a mapping unit, the mapping unit being a digital to digital converter, the mapping unit configured for mapping input electrical signals onto selected electrodes to generate output points of a predetermined output format.

* * * * *